US011955981B2

(12) United States Patent
Vankayala (10) Patent No.: US 11,955,981 B2
(45) Date of Patent: Apr. 9, 2024

(54) DIVIDED QUAD CLOCK-BASED INTER-DIE CLOCKING IN A THREE-DIMENSIONAL STACKED MEMORY DEVICE

(71) Applicant: Micron Technology, Inc., Boise, ID (US)

(72) Inventor: Vijayakrishna J. Vankayala, Allen, TX (US)

(73) Assignee: Micron Technology, Inc., Boise, ID (US)

(*) Notice: Subject to any disclaimer, the term of this patent is extended or adjusted under 35 U.S.C. 154(b) by 205 days.

(21) Appl. No.: 17/723,692

(22) Filed: Apr. 19, 2022

(65) Prior Publication Data

US 2023/0336181 A1    Oct. 19, 2023

(51) Int. Cl.
*H03L 7/191* (2006.01)
*G11C 7/10* (2006.01)
*H03K 19/20* (2006.01)
*H03L 7/197* (2006.01)

(52) U.S. Cl.
CPC ............ *H03L 7/191* (2013.01); *G11C 7/1039* (2013.01); *H03K 19/20* (2013.01); *H03L 7/1976* (2013.01)

(58) Field of Classification Search
CPC ..... H03L 7/191; H03L 7/1976; G11C 7/1039; G11C 7/222; H03K 19/20
USPC ...................................................... 365/233.1
See application file for complete search history.

(56) References Cited

U.S. PATENT DOCUMENTS

| 2010/0275037 A1* | 10/2010 | Lee | ........................ | G06F 13/385 |
| | | | | 713/323 |
| 2019/0189226 A1* | 6/2019 | Srivastava | ........... | G11C 29/028 |
| 2022/0223188 A1* | 7/2022 | Choi | ..................... | H03L 7/0818 |

FOREIGN PATENT DOCUMENTS

| CN | 104541473 B | * | 9/2017 | ............... | G06F 1/12 |
| WO | WO-2012125237 A2 | * | 9/2012 | ............... | G06F 1/04 |

* cited by examiner

*Primary Examiner* — Fernando Hidalgo
(74) *Attorney, Agent, or Firm* — Fletcher Yoder, P.C.

(57) ABSTRACT

A memory device includes a clock input configured to receive a clock from a host device. The memory device also includes a command input configured to receive command and address bits from the host device. The memory device further includes multiple die stacked in a three-dimensional stack. A first die of the plurality of die includes a first plurality of memory cells and first local control circuitry. The first local circuitry includes division circuitry configured to receive the clock from the clock input, generate a divided clock having a lower frequency than that of the clock, and generate multiple clocks from the divided clock with each of the multiple clocks having a lower frequency than the divided clock. The memory device also includes one or more transmitters configured to transmit the multiple clocks using a inter-die interconnects between the multiple die.

22 Claims, 10 Drawing Sheets

DIVIDED QUAD CLOCK-BASED INTER-DIE CLOCKING IN A THREE-DIMENSIONAL STACKED MEMORY DEVICE

BACKGROUND

Field of the Present Disclosure

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Memory devices utilize a clock frequency. The memory clock frequency has increased in successive memory generations. Most recently, the clock frequency increased from 1600 MHz to 3200/3600 Mhz. The memory density has also increased in successive memory generations. To implement higher density memories operating at the high clock speeds, three-dimensional stacked (3DS) memory devices may include an internal primary memory die (PMD) and an internal memory die (IMD). For example, 8-high (8H) and 16-high (16H) 3DS memories provide extremely high-density memory solutions at almost the same package area as a single die package. The inter-die communication of the commands and addresses (CA), data (DQ) and the clock are made using wirebonds (WBs) or through-silicon vias (TSVs). However, as the stack height and clock speed increase, transmitting the clock frequency becomes difficult and/or unreliable on the inter-die lines (e.g., WBs or TSVs). This difficulty/unreliability may be due to capacitance, resistance, and/or inductance on and around the inter-die lines.

BRIEF DESCRIPTION OF THE DRAWINGS

Various aspects of this disclosure may better be understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Memories generally include an array of memory cells. The memory cells may be read from or written to using command and address bits. The memory device may utilize a clock from a host device. This clock may be used to drive multiple memory die, but if the clock is relatively high frequency (e.g., 3600 MHz), driving the clock through inter-die interconnects (e.g., WBs, TSVs, etc.) may become difficult and/or unreliable. Instead, this clock may be divided in a primary memory die (PMD) to enable the PMD to send a divided clock to one or more internal memory die (IMDs) via the inter-die interconnects to increase signal integrity of such transmissions. By dividing the clock, the divided clock toggles at a fraction (e.g., ½) of the frequency of the clock and the command bits driven over the inter-die interconnects may toggle at a lower fraction (e.g., ¼) of the clock since the command bits are packaged onto a bus only on some (e.g., ½) of the cycles of the divided clock.

Signal integrity may be further increased by further dividing the fractionally divided clock into multiple clocks that are sent from the PMD to the IMDs, independently. These multiple clocks are much slower (e.g., ½ of the frequency of) the divided clock leading to even more improvement in the signal integrity. These multiple clocks may be used to reconstruct the divided clock in the IMDs after traversing the inter-die interconnects.

By improving signal integrity, the clock division and/or multiple clocks enable 3DS stack operation at fast speeds with larger stacks where usage of 1X clock frequencies may not be possible. The clock division also increases the timing margin at the destination latches in the target die. Also, the clock division reduces the power consumption of the inter-die (WB) toggling while keeping the number of interconnects low. Furthermore, circuitry operating using the divided clock may utilize less overall current consumption due to the lower frequency.

Figure 1:
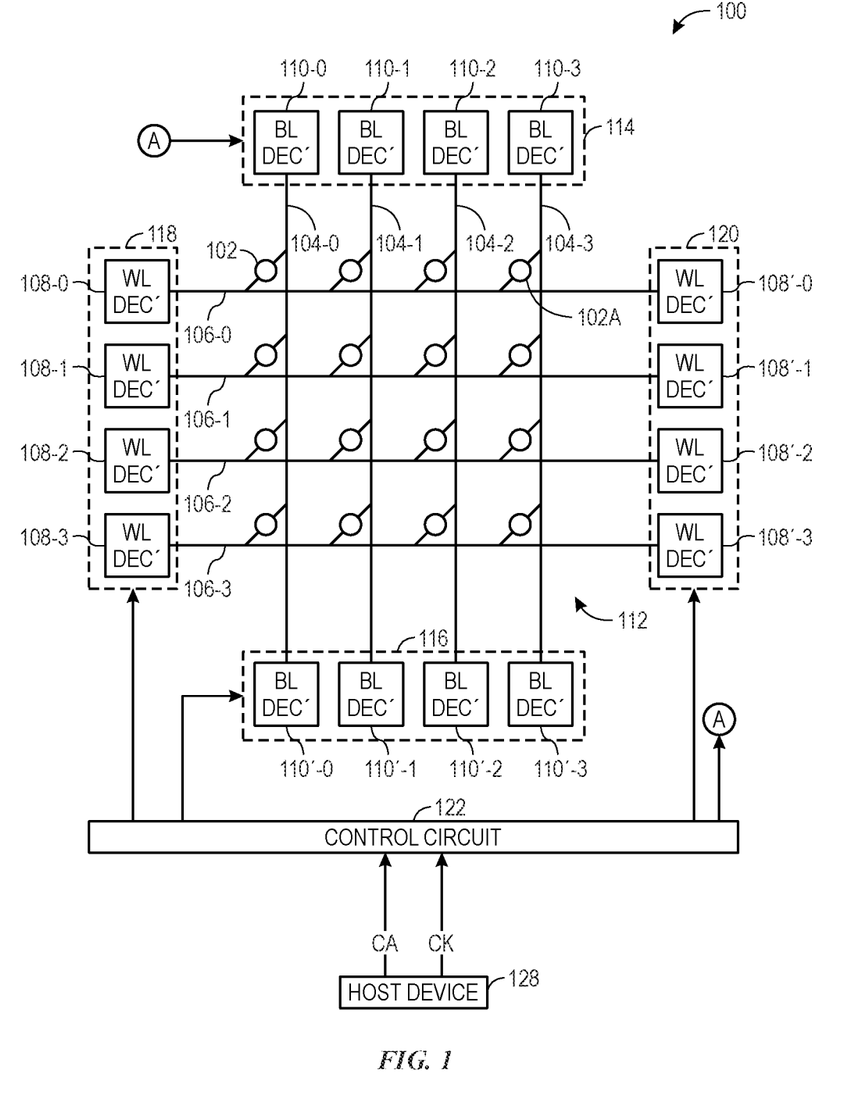
FIG. 1 is a simplified block diagram illustrating certain features of a memory device including a memory array of memory cells, according to an embodiment of the present disclosure.

Keeping the foregoing introduction in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element and may have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102. For instance, even though the following discussion is related to cross-point type memory, other types of memory devices may utilize the 3DS techniques divided clock discussed herein. For example, similar techniques may be applied to dynamic random-accessible memory (DRAM) devices (e.g., double-data rate type 5 (DDR5) DRAM, double-data rate type 4 (DDR4), etc.), NAND flash-based memory devices, and any other suitable memory device that may include more than one stacked die as part of the memory device.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity to the memory cells 102 (e.g., in particular, writing to selector device (SD) material of the memory cell) and reading the memory cells 102 (e.g., in particular, reading a voltage stored by the SD material of the memory cell) using a signal with a given (e.g., known) fixed polarity.

Commands and addresses (CA) may be received from a host device 128, such as a host processor reading data from and/or writing data to the memory device 100. The host device 128 may also transmit an external clock (Ck) to the memory device 100.

Figure 2:
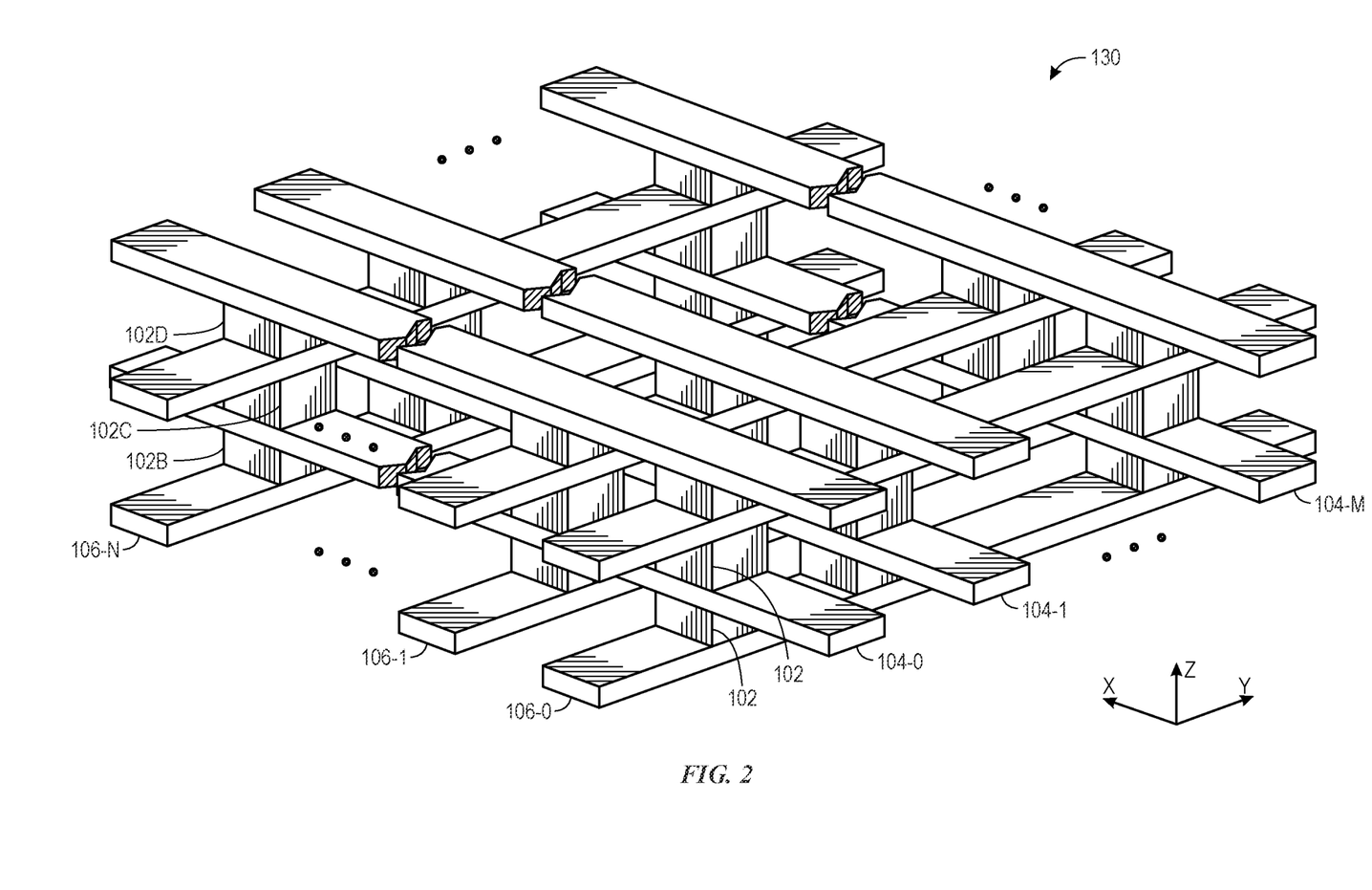
FIG. 2 is a side-view of a diagram illustrating the portion of the memory array of FIG. 1, according to an embodiment of the present disclosure.

FIG. 2 is a diagram illustrating a portion of a memory array 130 in accordance with an embodiment of the present disclosure. Inside the memory array 130, the memory cells are located at intersections of orthogonal lines. The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular wordline 106 and the bitline 104 combination serving as the electrodes for the memory cell 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104 corresponding to the respective memory cells 102 in response to a particular voltage applied to the selected of the wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or fewer bitlines 104, wordlines 106, and/or memory cells 102 than shown in the examples of FIG. 2. Each deck may include one or more memory cells 102 aligned in a same plane. The decks may be organized into die with each die including 1 or more decks. As previously discussed, these decks may be arranged in a 3DS arrangement with the dies stacked in a direction perpendicular to a substrate of the memory device 100.

Figure 3:
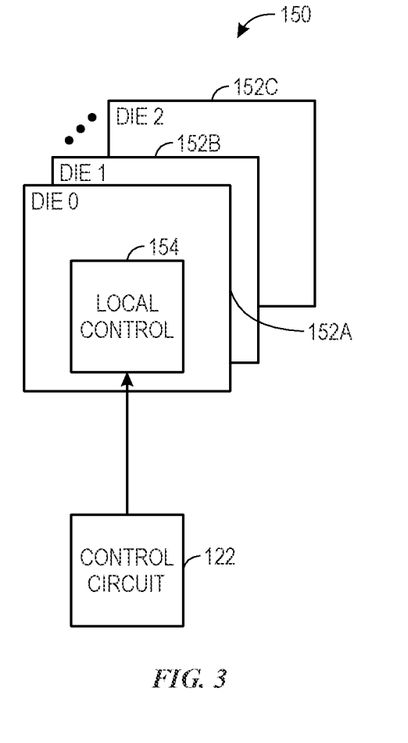
FIG. 3 is a simplified block diagram of the memory array of FIG. 1 in a three-dimensional stack (3DS) with the die of the 3DS including local control circuitry, according to an embodiment of the present disclosure.

FIG. 3 is a block diagram showing a 3DS stack 150 of multiple die 152A, 152B, and 152C (collectively referred to as die 152). As may be appreciated, although three die are illustrated in the stack, some embodiments of the memory device 100 may incorporate a 3DS stack 150 that may include 2, 3, 4, 5, or more die. As illustrated, the memory device 100 may utilize the control circuit 122 to control one or more local control circuitries 154. For instance, in some embodiments, the memory device 100 may include local control circuitry 154 on each die 152. In certain embodiments, the memory device 100 may include the local control circuitry 154 on only some of the die 152. Furthermore, in some embodiments, the memory device 100 may not include the control circuit 122 as a global control instead relying on the host device 128 and/or the local control circuitries 154 to perform actions discussed above as performed by the control circuit 122. For example, a local control circuitry 154 of the die 152A (PMD) may interact with the host device 128. The die 152A may broadcast commands received from the host device 128 to one or more of the other die 152. For instance, the die 152A may broadcast commands received from the host device 128 to all die 152 in the 3DS stack 150. Alternatively, the die 152A may broadcast to less than all of the die 152 in the 3DS stack 150. The receiving die 152 respond and process commands depending on the target address of the command. As such, the die 152A (PMD) handles all read and write data intended for the other die 152 (IMD). As previously noted, the die 152 in the 3DS stack 150 may be interconnected using WBs or TSVs, but the die 152 may also be interconnected using any other suitable interconnection technique.

Figure 4:
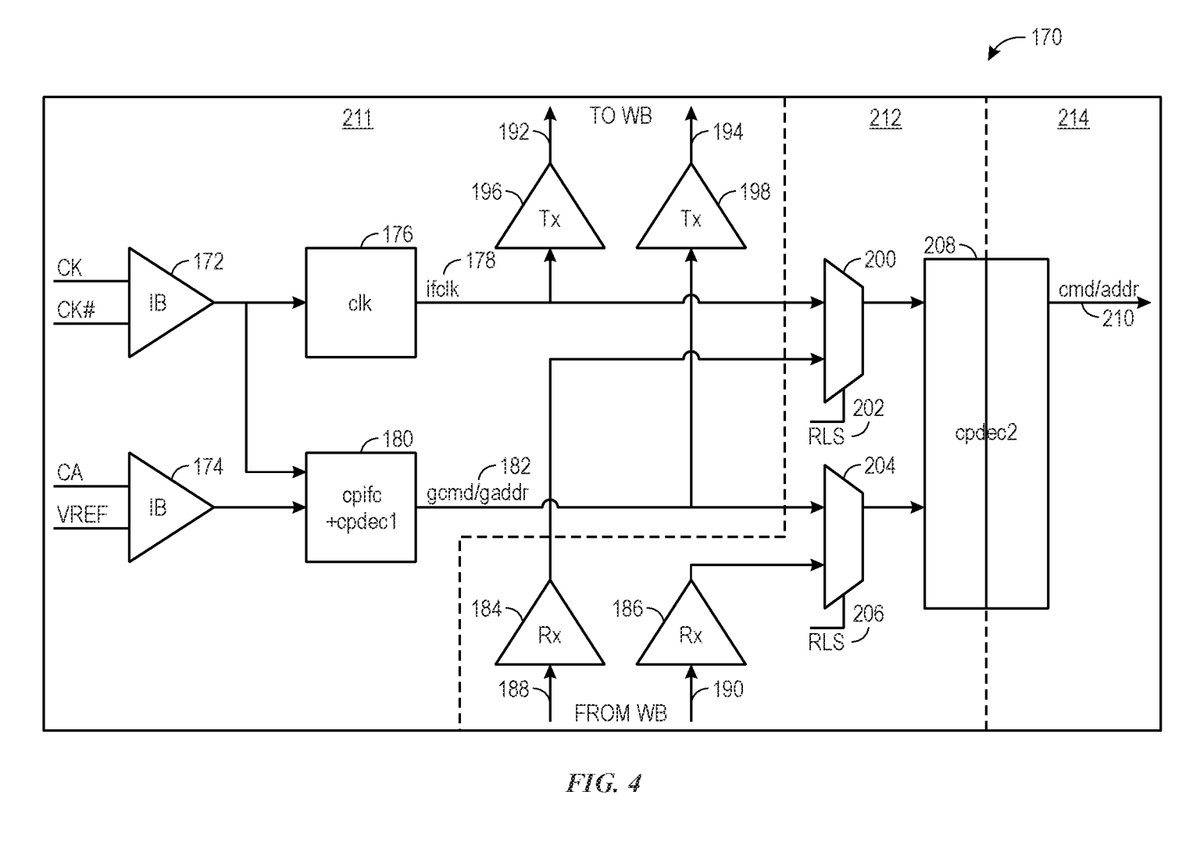
FIG. 4 is a simplified block diagram of the local control circuitry of FIG. 3 using a clock having an undivided frequency as received from a host device, according to an embodiment of the present disclosure.

FIG. 4 shows a block diagram of an embodiment 170 of the local control circuitry 154 of a die 152. As illustrated, the local control circuitry 170 receives the CA and Ck at respective input buffers 172 and 174 from the host device 128 and/or the control circuit 122. In some embodiments, the input buffer 172 may also receive a complementary clock (Ck#) that is complementary to the Ck and is used to aid in buffering the Ck. In some embodiments, the host device 128 may supply the Ck and the Ck#. Alternatively, the host device 128 may provide the Ck, and the memory device 100 may generate the Ck# using inversion techniques. Furthermore, the input buffer 174 may utilize a reference voltage (VREF) to capture the CA. The VREF may be transmitted from the host device 128 to the memory device 100, the VREF may be derived from a different source, or the memory device 100 may generate the VREF using a supply voltage.

The buffered Ck is internalized using clock circuitry 176. The clock circuitry 176 may include one or more latches or gates used to internalize the buffered Ck to generate an interface clock (ifclk) 178 that is transmitted to other die. A command processing interface (cpifc) receives the buffered Ck and the buffered CA and decodes the CA into internal commands and addresses (gcmd/gaddr) 182 using a command processor decode 1 (cpdec1). The ifclk 178 and the decoded gcmd/gaddr 182 are sent from the PMD (e.g., 152A) to the IMDs (e.g., 152B and 152C). In the illustrated embodiment, the ifclk 178 toggles at the same frequency (1X) as Ck and gcmd/gaddr 182 toggles at ½ of the frequency (½X) of Ck.

The IMDs receive the ifclk 178 and the gcmd/gaddr 182 via respective receivers 184 and 186. Since the gcmd/gaddr 182 may include multiple bits, the receiver 186 may be a multiple-bit receiver that includes receiving circuitry for each of the bits of the gcmd/gaddr 182 in parallel. The receivers 184 and 186 couple to the PMD using interconnects 188 and 190. As previously noted, the interconnects 188 and 190 may be WBs. Additionally or alternatively, the interconnects 188 and 190 may include TSVs or other suitable interconnect mechanisms for connecting the die 152 of the 3DS stack 150 together. In the PMD, the ifclk 178 and the gcmd/gaddr 182 are transmitted using transmitters 196 and 198 that are coupled to interconnects 192 and 194. Since the gcmd/gaddr 182 may include multiple bits, the transmitter 198 may be a multiple-bit transmitter that includes transmitter circuitry to transmit the command and address bits in parallel. Like the interconnects 188 and 190, the interconnects 192 and 194 may be WBs. Additionally or alternatively, the interconnects 192 and 194 may include TSVs or other suitable interconnect mechanisms for connecting the die 152 of the 3DS stack 150 together. As may be appreciated, the interconnects 188 and 190 of an IMD couple to (or are the same as) the respective interconnects 192 and 194 of the PMD.

The local control circuitry 154 may include a multiplexer 200 to select between receiving the ifclk 178 from the clock circuitry 176 and receiving the ifclk 178 from the receiver 184. This selection is driven by a control signal (RLS) 202. For instance, the RLS 202 may be set by a fuse before, during, or after manufacture. The RLS 202 of the PMD may be set to select receiving the ifclk 178 from the clock circuitry 176 while the RLS 202 of the IMDs may be set to select receiving the ifclk 178 from the receiver 184.

The local control circuitry 154 may include a multiplexer 204 to select between receiving the gcmd/gaddr 182 from the cpifc 180 and receiving the gcmd/gaddr 182 from the receiver 186. This selection is driven by a control signal (RLS) 206. For instance, the RLS 206 may be set by a fuse before, during, or after manufacture. The RLS 206 of the PMD may be set to select receiving the gcmd/gaddr 182 from the cpifc 180 while the RLS 202 of the IMDs may be set to select receiving the gcmd/gaddr 182 from the receiver 186.

The local control circuitry 154 may also include a command processor decode 2 (cpdec2) 208. The cpdec2 208 receives the gcmd/gaddr 182 from the multiplexer 204 and determines whether the die 152 on which the local control circuitry 154 resides is the target die of the CA. If it is, the cpdec2 208 transmits the cmd/addr 210 the target cells of the die 152. If the die 152 on which the local control circuitry 154 resides is not the target die, the cpdec2 208 does not transmit the cmd/addr 210.

As illustrated, the local control circuitry 154 may be generic to both PMDs and IMDs. However, a PMD portion 211 may be inactive in IMDs while a portion 212 is active for both PMDs and IMDs. A target portion 214 is active only for the target die due to the cpdec2 208 blocking command and address bits at its input when the corresponding die is not the target die. By utilizing a single design for the local control circuitries 154 regardless of whether the die on which it resides is a PMD or an IMD, production efficiencies may be leveraged. However, in some embodiments, the PMD portion 211 may be omitted from the IMDs. Additionally or alternatively, the receivers 184 and 186 may be omitted from the PMD.

In the embodiment 170, as the stack height and clock speed increases, transmitting the ifclk 178 at 1X clock frequency on the interconnects 188, 190, 192, and 194 may become difficult and/or unreliable. Furthermore, sending the ifclk 178 at 1X clock frequency and 'gcmd/gaddr 182 at ½ clock frequency may introduce mismatches between their timing at faster frequencies (e.g., 3200/3600 MHz). Additionally, operating the cpdec2 208 on the target die at 1X of clock frequency using the ifclk 178 may result in relatively high current consumption.

Figure 5:
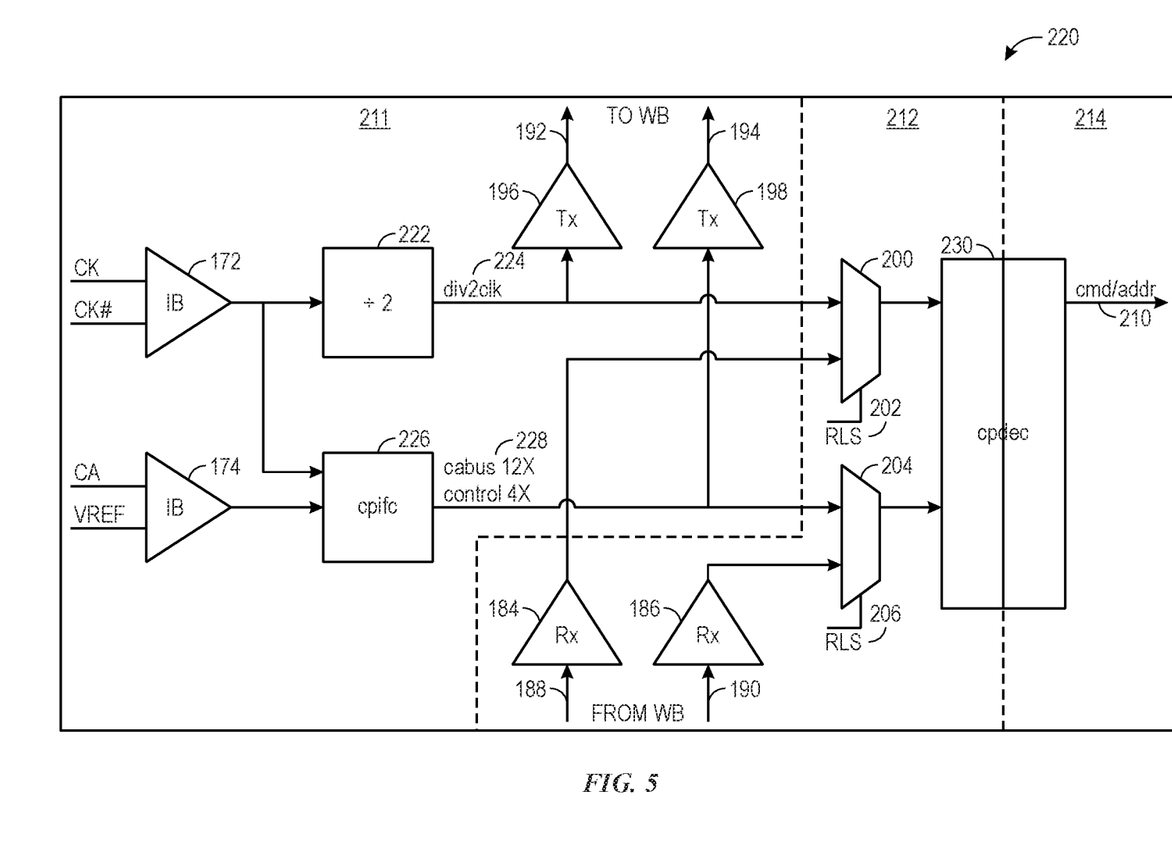
FIG. 5 is a simplified block diagram of the local control circuitry of FIG. 3 using a divided clock, according to an embodiment of the present disclosure.

FIG. 5 is an embodiment 220 of the local control circuitry 154. The embodiment 220 functions similar to the embodiment 170 except that the clock circuitry 176 has/is replaced by a clock divider 222 to divide the buffered Ck by two to generate a divided-by-two clock (div2clk) 224. Thus, the PMD generates the div2clk 224 and transmits it to the IMDs using the transmitter 196. In some embodiments, the clock divider 222 may divide by a different number (e.g., 3, 4, 8, etc.) with the divided clock being divided by that number. A command processor interface (cpifc) 226 differs from the cpifc 180 of FIG. 4 in that the cpifc 226 does not decode the buffered CA. A CA bus (cabus) 228 has a number of bits (e.g., 12). The number of bits carried in the cabus 228 may be based on the number of rising edges for the command. For example, a two user interface (2UI) has two consecutive rising edges (e.g., 12 bits) instead of a single rising edge (e.g., 6 bits). Additionally or alternatively, an 8UI may have 8 consecutive rising edges (e.g., 48 bits). To carry the bits for 8UI or any number of cycles greater than 2UI, the width of the cabus 228 may be expanded. Alternatively, the bits may be carried on the cabus 228 in consecutive cycles. For instance, a 2UI command may be carried on the cabus 228 in a single cycle, while an 8UI command may be carried on the cabus 228 in 4 consecutive cycles. Furthermore, the number of bits per rising edge may change based on the design for the memory device 100. In the embodiment 220, the cpifc 226 may also generate one or more control bits (e.g., 4 bits). The control bits and the cabus 228 may be center aligned with the falling edge of the div2clk 224 to maximize the timing margin in the target die. Since the ifclk is divided into the div2clk 224, the div2clk 224 toggles at ½ of the frequency of ifclk while the cabus 228 toggles at ¼ the frequency of ifclk.

The embodiment 220 is also different from the embodiment 170 in that the multiplexers 200 and 204 couple to a single command processor decode 230 that functions using the div2clk 224. Use of the div2clk 224 enables faster operation (e.g., using a faster (3200/3600 or greater MHz) clock) without the inherent difficulties in driving the faster clock through the WBs, TSVs, or other die interconnects. The use of the div2clk 224 also reduces the current consumption by the cpdec 230 of FIG. 5 relative to the cpdec2 208 of FIG. 4 during active operation.

Figure 6:
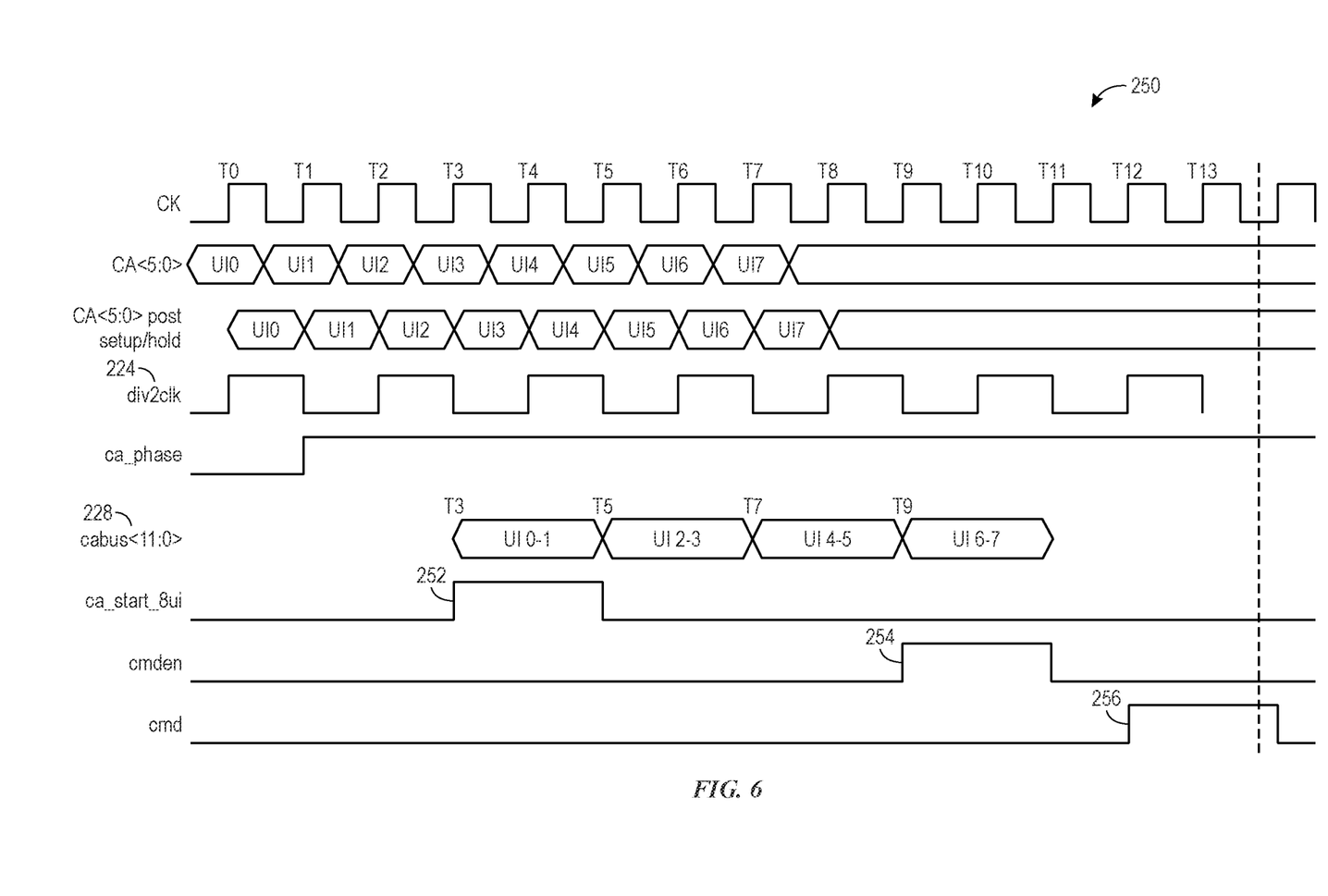
FIG. 6 is a timing diagram of an 8UI command received by the local control circuitry of FIG. 5, according to an embodiment of the present disclosure.

FIG. 6 is a timing diagram 250 for an 8UI command. As illustrated, the timing diagram 250 includes the Ck and CA bits. In the illustrated embodiment 6 bits (e.g., CA <5:0>)

are received per cycle of the Ck. The CA bits are phase corrected on the PMD to center align with the falling edge of div2clk 224. The phase information (ca_phase) is sent to each of the die. A pulse 252 on ca_start_8ui indicates that the first bits of an 8UI command are loaded onto the cabus 228. A pulse 254 on cmden indicates that the last bits of the 8UI command are loaded on the cabus 228 and that 8UI command is a legal command. The 8UI command signals then fire on the target die as illustrated by the pulse 256. These pulses are sent to all die 152 from the PMD. In the case of an illegal 8UI command, a chip select signal fires again during UI1-UI7 and cmden does not fire thereby disabling the final command from firing on the target die.

By dividing the ifclk to the div2clk 224, the div2clk 224 toggles at ½ the frequency of the ifclk, and the cabus 228 toggles at ¼ of the frequency of the ifclk. However, when the speed of the Ck is high, the divided frequency of ½ may still be at or near the boundary for feasible transmission through the inter-die interconnects. To avoid this issue and/or to further increase signal integrity of clocking through the inter-die interconnects, the div2clk 224 may be further divided into multiple clocks that are then transmitted separately through the inter-die interconnects. When the multiple clocks are received at the IMDs, the IMDs may reconstruct the div2clk 224.

Figure 7:
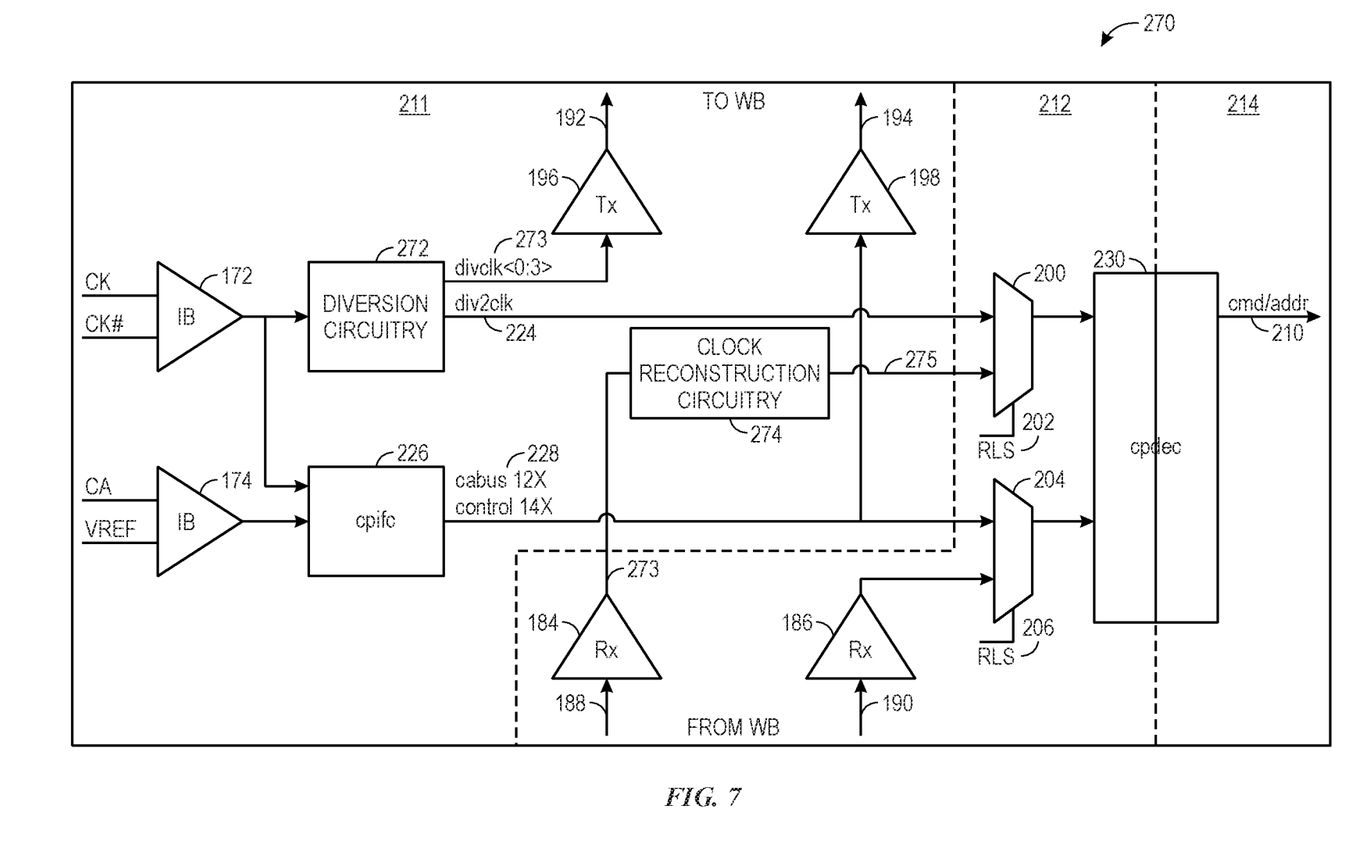
FIG. 7 is a simplified block diagram of the local control circuitry of FIG. 3 using divided quad clock-based clocking with division circuitry and clock reconstruction circuitry, according to an embodiment of the present disclosure.

FIG. 7 is a block diagram of an embodiment 270 of the local control circuitry 154 that divides the div2clk 224 into multiple clocks for transmission via the inter-die interconnects. The embodiment 270 is similar to the embodiment 220 except that the division circuitry 272 replaces the clock divider 222 that outputs only the div2clk 224. As discussed below, the division circuitry 272 outputs the div2clk 224 while also separating the div2clk 224 into multiple divided clocks (divclk<0:3>) 273. In the illustrated embodiment, the divclk<0:3> 273 is four clocks that each are ½ of the frequency of the div2clk 224. In other words, the div2clk 224 is ¼ of the ifclk and the same frequency at which the cabus 228 toggles. Alternatively, the multiple divided clocks may include two, three, or more separate clocks rather than four clocks. Since, in the illustrated embodiment, the div2clk 224 is sent in multiple parts, the transmitter 196 may be multiple-bit transmitter circuitry that may transmit the bits of the divclk<0:3> 273 through multiple inter-die interconnects (e.g., WBs, TSVs, etc.) in parallel.

Since the div2clk 224 is transmitted in multiple bits using the divclk<0:3> 273, the receiver 184 in the IMDs may also include multiple bit receiving circuitry that may receive the bits of the divclk<0:3> 273 through multiple inter-die interconnects in parallel. These multiple bits of the divclk<0:3> 273 may be transmitted to clock reconstruction circuitry 274 that reconstructs the div2clk 224 from the multiple bits of the divclk<0:3> 273 to generate a reconstructed div2clk (rdiv2clk) 275. In other words, once the multiple divided clocks have crossed the inter-die interconnects where signal integrity may be impacted by the frequency of feasible transmission, the clocks may be rejoined to reconstruct the faster div2clk 224.

As with the previous embodiment, the PMD portion 211 may be omitted from inclusion in the local control circuitries 154 of the IMDs. Similarly, the clock reconstruction circuitry 274 and/or the receivers 184 and 186 may be omitted from the local control circuitry 154 of the PMD as these components will not be used in the PMD. However, in some embodiments, the components in the PMD and/or the IMDs may be included to increase manufacturing efficiencies for the local control circuitries 154 of the PMD and the IMDs.

Figure 8:
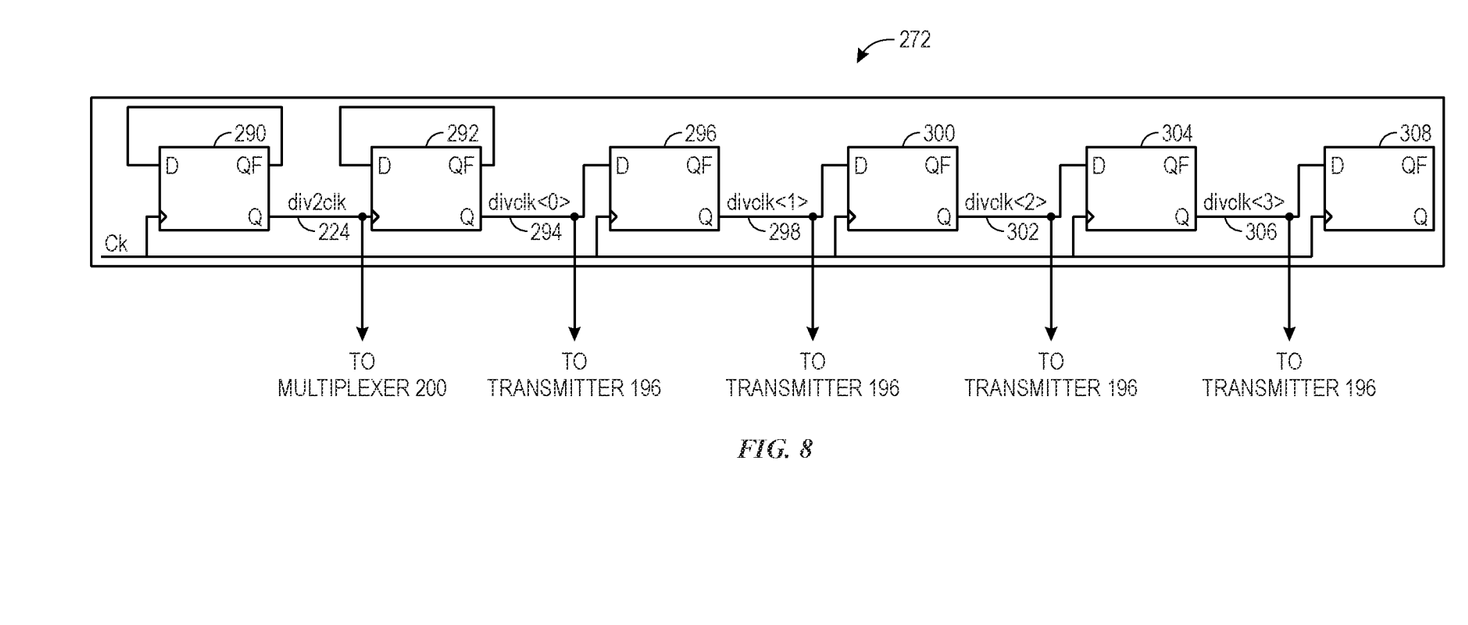
FIG. 8 is a schematic diagram of the division circuitry of FIG. 7, according to an embodiment of the present disclosure.

FIG. 8 is a schematic diagram of an embodiment of the division circuitry 272. As may be appreciated, other embodiments of the division circuitry 272 other than that shown in FIG. 8 may be implemented to achieve the results discussed previously. As illustrated, the division circuitry 272 receives the buffered Ck (ifclk) at a clock input of a flip-flop 290. The complementary output of the flip-flop 290 is coupled to its data input to cause the flip-flop to toggle its output upon each rising edge of the Ck to cause the output as div2clk 224 to have one half of the frequency of the Ck. This div2clk 224 is used to clock a flip-flop 292 by being transmitted to the clock input of the flip-flop 292. The div2clk 224 is also transmitted to the multiplexer 200 as shown in FIG. 7. The complementary output of the flip-flop 292 is coupled to its data input to cause the flip-flop to toggle its output upon each rising edge of the div2clk 224 to cause the output as divclk<0> 294 to have one half of the frequency of the div2clk 224.

The divclk<0> 294 is transmitted to a data input of a flip-flop 296. The clock input of the flip-flop 296 is coupled to the Ck. The output of the flip-flop 296 is a divclk<1> 298 that is the same as the divclk<0> 294 except that divclk<1> 298 is shifted by one cycle of Ck. The divclk<1> 298 is transmitted to a data input of a flip-flop 300. The clock input of the flip-flop 300 is coupled to the Ck. The output of the flip-flop 300 is a divclk<2> 302 that is the same as the divclk<1> 298 except that divclk<2> 302 is shifted by one cycle of Ck. The divclk<2> 302 is transmitted to a data input of a flip-flop 304. The clock input of the flip-flop 304 is coupled to the Ck. The output of the flip-flop 304 is a divclk<3> 306 that is the same as the divclk<2> 302 except that divclk<3> 306 is shifted by one cycle of Ck. In other words, the multiple divided clocks divclk<0:3> 273 are a divided version of the div2clk 224 that is shifted and output from the serially connected flip-flops 292, 296, 300, and 304 to the transmitter 196.

In some embodiments, the divclk<3> 306 may be transmitted to a flip-flop 308 for further use within the memory device 100. Alternatively, in some embodiments, the flip-flop 308 may be omitted with the divclk<3> 306 being only transmitted to the transmitter 196.

Figure 9:
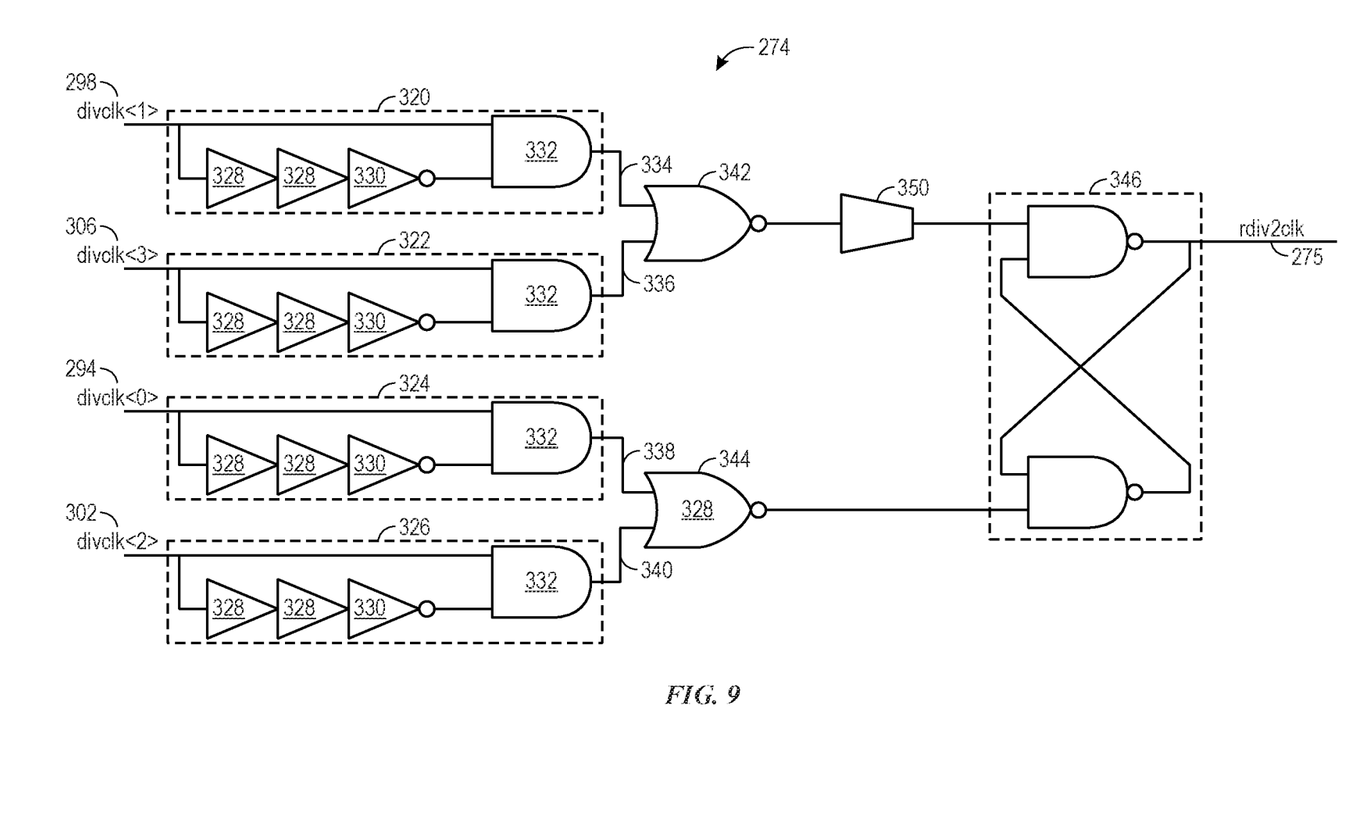
FIG. 9 is a schematic diagram of the clock reconstruction circuitry, according to an embodiment of the present disclosure.

FIG. 9 is a schematic diagram of an embodiment of the clock reconstruction circuitry 274 of FIG. 7. As may be appreciated, other embodiments of the clock reconstruction circuitry 274 other than that shown in FIG. 9 may be implemented to achieve the results discussed previously. As illustrated, the clock reconstruction circuitry 274 receives the divclk<1> 298, the divclk<3> 306, the divclk<0> 294, and the divclk<2> 302 from the receiver 184 as components of the divclk<0:3> 273. Rising edges of the divclk<0> 294 and the divclk<2> 302 are configured to cause rising edges on the rdiv2clk 275 while rising edges of the divclk<1> 298 and the divclk<3> 306 are configured to cause falling edges on the rdiv2clk 275.

Each of the components of the divclk<0:3> 273 are passed through a respective pulse generator. For instance, the divclk<1> 298 is transmitted to pulse generator 320, the divclk<3> 306 is transmitted to pulse generator 322, the divclk<0> 294 is transmitted to pulse generator 324, and the divclk<2> 302 is transmitted to pulse generator 326. The illustrated pulse generators 320, 322, 324, and 326 each include a number (e.g., 2) of delay gates 328 and an inverter 330 that are combined with the pulse generator input via an AND gate 332. The propagation delay through the delay gates 328 and the inverter 330 set the width of each of the resulting pulses. Accordingly, the pulse generators may include different numbers of gates to change the width of each pulse in various embodiments. In some embodiments, other suitable types of pulse generators may be used than those illustrated. Indeed, in some embodiments, the different components of the divclk<0:3> 273 may be transmitted to different types of pulse generators.

The pulse generator 320 receives the divclk<1> 298 and generates a divclkpul<1> 334 at the output of the respective AND gate 332. Also, the pulse generator 322 receives the divclk<3> 306 and generates a divclkpul<3> 336 at the output of the respective AND gate 332. Similarly, the pulse generator 324 receives the divclk<0> 294 and generates a divclkpul<0> 336 at the output of the respective AND gate 332. Likewise, the pulse generator 326 receives the divclk<2> 302 and generates a divclkpul<2> 340 at the output of the respective AND gate 332.

The divclkpul<1> 334 and the divclkpul<3> 336 are input to a NOR gate 342. The divclkpul<0> 338 and the divclkpul<2> 340 are input to a NOR gate 344. The output of the NOR gate 342 is transmitted to a first leg of a set-reset (SR) latch 346, and the output of the NOR gate 344 is transmitted to a second leg of the SR latch 346. When a pulse of the divclkpul<0> 338 or the divclkpul<2> 340 occurs, the output of the NOR gate 344 causes a rising edge on the rdiv2clk 275. When a pulse of the divclkpul<1> 334 and the divclkpul<3> 336 follows the pulse on the divclkpul<0> 338 or the divclkpul<2> 340, the output of the NOR gate 342 causes a falling edge on the rdiv2clk 275. The output of the NOR gate 344 propagating through the SR latch 346 to the rdiv2clk 275 travels through both gates (e.g., NAND gates) of the SR latch 346 while the output of the NOR gate 342 only propagates through a single gate of the SR latch 346 to the rdivclk 275. To address this mismatch and align the propagation paths, a pass gate 350 may be included between the output of the NOR gate 342 and the SR latch 346 to ensure the same propagation delays for both paths.

Figure 10:
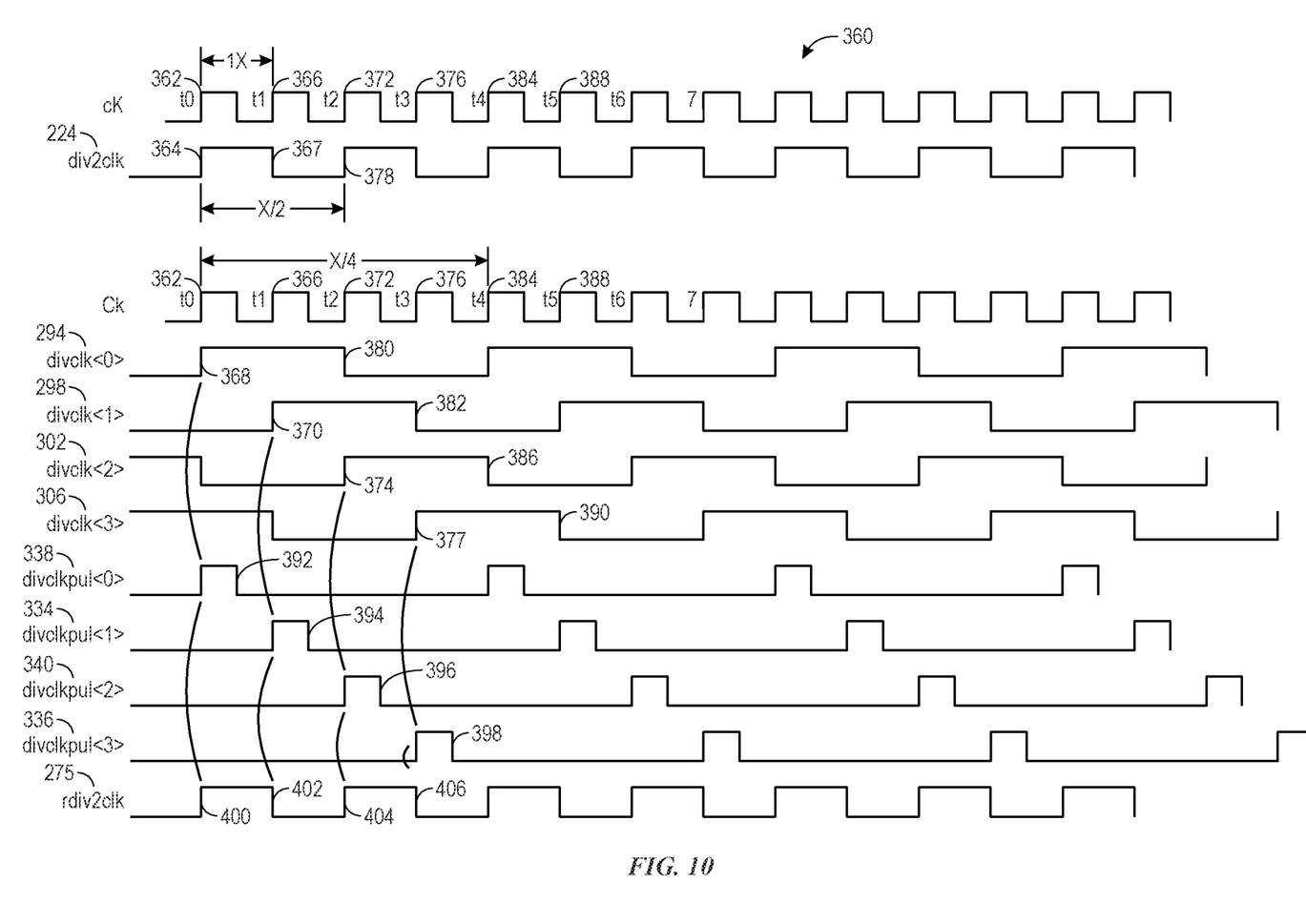
FIG. 10 is a timing diagram of clock reconstruction using the clock reconstruction circuitry, according to an embodiment of the present disclosure.

FIG. 10 is a timing diagram 360 of signals in the embodiment 270 of FIG. 7. In the division circuitry 272, the Ck is used to generate the div2clk 224 using the flip-flop 290. As illustrated, the div2clk 224 has half the frequency of the Ck. A rising edge 362 of the Ck causes a rising edge 364 in the div2clk 224 while the next rising edge 366 of the Ck causes a falling edge 367 of the div2clk 224.

The divclk<0> 294 is generated by dividing the div2clk 224 using the flip-flop 292. Specifically, the rising edge 364 causes a rising edge 368 of the divclk<0> 294. The divclk<0> 294 is then shifted by a cycle of the Ck using the flip-flop 296. Therefore, the rising edge 368 and a rising edge 366 of the Ck cause a rising edge 370 of the divclk<1> 298 one cycle of the Ck away from the rising edge 366. The divclk<1> 296 is then shifted by a cycle of the Ck using the flip-flop 300. Therefore, the rising edge 370 and a rising edge 372 of the Ck cause a rising edge 374 of the divclk<2> 302 one cycle of the Ck away from the rising edge 370. The divclk<2> 302 is then shifted by a cycle of the Ck using the flip-flop 304. Therefore, the rising edge 374 and a rising edge 376 of the Ck cause a rising edge 377 of the divclk<3> 306 one cycle of the Ck away from the rising edge 374.

The falling edges of the divclk<0:3> are also controlled using the div2clk 224 and the Ck. Specifically, the rising edge 372 of the Ck causes a rising edge 378 of the div2clk 224. In turn, this rising edge 378 of the div2clk 224 causes a falling edge 380 of the divclk<1> 298 by toggling the flip-flop 292. The falling edge 380 then shifts through the flip-flops 296, 300, and 304 on successive cycles of the Ck. Specifically, the rising edge 376 of the Ck and the falling edge 380 cause a falling edge 382 of the divclk<1> 298. In turn, a rising edge 384 of the Ck and the falling edge 382 cause a falling edge 386 of the divclk<2> 302. Likewise, a rising edge 388 of the Ck and the falling edge 386 cause a falling edge 390 of the divclk<3> 306.

The pulse generator 320 utilizes the rising edge 368 of the divclk<1> 294 to generate a pulse 392 of the divclkpul<0> 338 having a width set by the pulse generator 320. Also, the pulse generator 322 utilizes the rising edge 370 of the divclk<1> 298 to generate a pulse 394 of the divclkpul<1> 334 having a width set by the pulse generator 322. Similarly, the pulse generator 324 utilizes the rising edge 374 of the divclk<2> 302 to generate a pulse 396 of the divclkpul<2> 340 having a width set by the pulse generator 324. Likewise, the pulse generator 326 utilizes the rising edge 377 of the divclk<3> 306 to generate a pulse 398 of the divclkpul<3> 336 having a width set by the pulse generator 326.

The pulse 392 causes a rising edge 400 in the rdiv2clk 275 via the SR latch 346, and the pulse 394 causes a falling edge 402 in the rdiv2clk 275 via the SR latch 346. Similarly, the pulse 396 causes a rising edge 404 in the rdiv2clk 275 via the SR latch 346, and the pulse 398 causes a falling edge 406 in the rdiv2clk 275 via the SR latch 346.

As illustrated, the foregoing techniques rely on four clocks to use only rising edges of the components of the divclk<0:3> 273. Using only rising edges enables the foregoing using falling edges as falling edges may look different than rising edges in implementation due to the high frequencies of clocks transmitted over the inter-die interconnects (e.g., WBs, TSVs, etc.). The difference in the rising and falling edges may cause push out of the falling edge potentially negatively impacting timing. However, if additional margin is available or falling edge control is maintained, the divclk<2> 302 and the divclk<3> 306 may be omitted instead relying on the falling edges of the divclk<0> 294 and the divclk<1> 298 in place of the rising edges of the divclk<2> 302 and the divclk<3> 306.

This divided clock usage with the divided clock split into component clocks improves the signal integrity over the inter-die interconnects (e.g., WBs. TSVs, etc.). By improving signal integrity, the clock division enables 3DS stack operation at fast speeds with larger stacks where usage of 1X (or even X/2) clock frequencies may not be possible.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a clock input configured to receive a clock from a host device;

a command input configured to receive command and address bits from the host device; and a plurality of die stacked in a three-dimensional stack, wherein a first die of the plurality of die comprises:
a first plurality of memory cells; and
first local control circuitry comprising:
division circuitry configured to:
receive the clock from the clock input;
generate a divided clock having a lower frequency than that of the clock; and
generate a plurality of component clocks from the divided clock with each of the plurality of component clocks having a lower frequency than the divided clock; and
one or more transmitters configured to transmit the plurality of component clocks using a plurality of inter-die interconnects between the plurality of die.

2. The memory device of claim 1, wherein the first die is a primary memory die, and the remaining die of the plurality of die are internal memory die that receive the plurality of component clocks from the primary memory die.

3. The memory device of claim 2, wherein the remaining die of the plurality of die each comprise:
a second plurality of memory cells;
second local control circuitry comprising one or more receivers configured to receive the plurality of component clocks; and
clock reconstruction circuitry configured to reconstruct the divided clock from the plurality of component clocks.

4. The memory device of claim 3, wherein the clock reconstruction circuitry comprises a plurality of pulse generators each configured to generate a respective pulse signal based at least in part on a respective component clock of the plurality of component clocks.

5. The memory device of claim 4, wherein generating the respective pulse signal is based on only a rising edge of the corresponding component clock.

6. The memory device of claim 4, wherein the clock reconstruction circuitry comprises:
a first logic gate to combine a first set of respective pulses corresponding to a first set of component clocks of the plurality of component clocks, wherein an output of the first logic gate is configured to cause a rising edge in the reconstructed divided clock; and
a second logic gate to combine a second set of respective pulses corresponding to a second set of component clocks of the plurality of component clocks, wherein an output of the second logic gate is configured to cause a falling edge in the reconstructed divided clock.

7. The memory device of claim 6, wherein the first logic gate comprises a first NOR gate, and the second logic gate comprises a second NOR gate.

8. The memory device of claim 6, wherein the clock reconstruction circuitry comprises a set-reset (SR) latch that is configured to:
receive an output of the first logic gate at a first leg of the SR latch;
receive an output of the second logic gate at a second leg of the SR latch; and
output the reconstructed divided clock.

9. The memory device of claim 8, wherein the clock reconstruction circuitry comprises a pass gate at the second leg of the SR latch to balance propagation from the output of the first logic gate to the output of the SR latch with propagation from the output of the second logic gate to the output of the SR latch.

10. The memory device of claim 1, wherein the first local control circuitry comprises a primary memory die clock reconstruction circuitry that is inactive during operation of the memory device.

11. A memory device, comprising:
a clock input configured to receive a clock from a host device;
a command input configured to receive command and address bits from the host device;
a first die comprising a first plurality of memory cells and first local control circuitry, wherein the first local control circuitry is configured to:
receive the clock from the clock input;
receive the command and address bits from the command input;
transmit the command and address bits to a second die, wherein the first die and second die are arranged in a three-dimensional stack;
generate, in division circuitry of the first die, a divided clock from the clock in division circuitry;
generate, in the division circuitry, multiple clocks from the divided clock, wherein the multiple clocks have lower frequencies than the divided clock; and
transmit the multiple clocks to the second die;
a plurality of inter-die interconnects; and
the second die comprising:
a second plurality of memory cells; and
second local control circuitry, wherein the second local control circuitry comprises:
one or more receivers configured to receive the multiple clocks and the command and address bits from the first die via a first portion of the plurality of inter-die interconnects;
clock reconstruction circuitry configured to reconstruct, in the second die, the divided clock from the multiple clocks; and
a decoder configured to utilize the reconstructed divided clock to decode the command and address bits.

12. The memory device of claim 11, wherein the division circuitry comprises a first flip-flop configured to receive the clock and to generate the divided clock having half the frequency of the clock.

13. The memory device of claim 12, wherein the division circuitry comprises a second flip-flop configured to receive the divided clock and to generate a first clock of the multiple clocks having half the frequency of the divided clock.

14. The memory device of claim 13, wherein the division circuitry comprises a plurality of serially connected flip-flops that is configured to receive the first clock and shift out successive clocks of the multiple clocks.

15. The memory device of claim 14, wherein the shift between the successive clocks of the multiple clocks comprises a shift of one cycle of the clock.

16. The memory device of claim 11, wherein the first die comprises a bottom die of the three-dimensional stack.

17. The memory device of claim 11, wherein the plurality of inter-die interconnects between the first die and the second die comprises wirebonds, through-silicon vias, or a combination thereof.

18. The memory device of claim 11, comprising a third die in the three-dimensional stack, wherein the third die comprises:
a third plurality of memory cells; and third local control circuitry, wherein the third local control circuitry comprises:
one or more additional receivers configured to receive the multiple clocks and the command and address bits from the first die via a second portion of the plurality of inter-die interconnects;
additional clock reconstruction circuitry configured to reconstruct, in the third die, an additional reconstructed divided clock from the multiple clocks; and
an additional decoder configured to utilize the reconstructed additional divided clock to decode the command and address bits.

19. A method, comprising:
at a primary memory die of a three-dimensional stack of a memory device, receiving a clock from a host device;
in the primary memory die, dividing the clock to generate a divided clock;
in the primary memory die, dividing the divided clock to generate a plurality of lower frequency clocks having a frequency lower than a frequency of the divided clock;
transmitting the plurality of lower frequency clocks from the primary memory die to one or more internal memory die in the three-dimensional stack of the memory device using first inter-die interconnects;
at one or more internal memory die of the three-dimensional stack, receiving the plurality of lower frequency clocks from the primary memory die over the first inter-die interconnects;
in the one or more internal memory die, reconstructing the divided clock from the received lower frequency clocks; and
in the one or more internal memory die, decoding command and address bits using the reconstructed divided clock.

20. The method of claim 19, comprising:
at the primary memory die of the three-dimensional stack, receiving the command and address bits from the host device; and
transmitting the command and address bits from the primary memory die to the one or more internal memory die via second inter-die interconnects.

21. The method of claim 19, wherein the first inter-die interconnects comprise wirebonds, through-silicon vias, or a combination thereof.

22. The method of claim 19, wherein transmitting the lower frequency clocks comprises transmitting the lower frequency clocks using one or more transmitters of the primary memory die, and receiving the lower frequency clocks comprises receiving the lower frequency clocks using one or more receivers of the one or more internal memory die.

* * * * *